US008383011B2

(12) United States Patent
Castillo et al.

(10) Patent No.: US 8,383,011 B2
(45) Date of Patent: Feb. 26, 2013

(54) CONDUCTIVE INKS WITH METALLO-ORGANIC MODIFIERS

(75) Inventors: Imelda Castillo, Somerset, NJ (US); Xuerong Gao, Livingston, NJ (US)

(73) Assignee: BASF SE, Ludwigshafen (DE)

( * ) Notice: Subject to any disclaimer, the term of this patent is extended or adjusted under 35 U.S.C. 154(b) by 101 days.

(21) Appl. No.: 12/022,358

(22) Filed: Jan. 30, 2008

(65) Prior Publication Data
US 2009/0188555 A1 Jul. 30, 2009

(51) Int. Cl.
*H01B 1/06* (2006.01)

(52) U.S. Cl. .................. 252/506; 252/514; 252/519.51; 106/31.13; 136/252; 136/256

(58) Field of Classification Search .................. 252/512, 252/500, 514, 519.51, 506; 106/31.92, 1.14, 106/31.13; 156/89.18; 427/596; 361/321.5; 501/79; 136/252, 256
See application file for complete search history.

(56) References Cited

U.S. PATENT DOCUMENTS

| | | | | |
|---|---|---|---|---|
| 3,545,986 | A * | 12/1970 | Short | 106/1.14 |
| 3,755,723 | A * | 8/1973 | Short | 361/321.5 |
| 5,162,062 | A | 11/1992 | Carroll et al. | |
| 5,252,521 | A | 10/1993 | Roberts | |
| 5,378,408 | A | 1/1995 | Carroll et al. | |
| 5,439,852 | A | 8/1995 | Hormadaly | |
| 5,468,695 | A * | 11/1995 | Carroll et al. | 501/79 |
| 5,491,118 | A | 2/1996 | Hormadaly | |
| 5,578,533 | A | 11/1996 | Manabe et al. | |
| 5,645,765 | A * | 7/1997 | Asada et al. | 252/519.51 |
| 5,714,420 | A | 2/1998 | Sakoske | |
| 5,753,571 | A | 5/1998 | Donohue | |
| 5,795,501 | A | 8/1998 | Kano | |
| 5,882,722 | A | 3/1999 | Kydd | |
| 5,891,283 | A * | 4/1999 | Tani et al. | 156/89.18 |
| 6,036,889 | A * | 3/2000 | Kydd | 252/512 |
| 6,255,239 | B1 | 7/2001 | Sakoske | |
| 6,348,426 | B1 | 2/2002 | Sanada et al. | |
| 6,814,795 | B2 | 11/2004 | McVicker et al. | |
| 7,138,347 | B2 | 11/2006 | Konno | |
| 7,211,205 | B2 | 5/2007 | Conaghan et al. | |
| 7,691,294 | B2 | 4/2010 | Chung et al. | |
| 7,727,424 | B2 * | 6/2010 | Konno | 252/514 |
| 7,731,868 | B2 * | 6/2010 | Konno | 252/514 |
| 2002/0124910 | A1 | 9/2002 | Miyazaki et al. | |
| 2003/0224205 | A1 | 12/2003 | Li et al. | |
| 2004/0155227 | A1 | 8/2004 | Bechtloff et al. | |
| 2005/0037910 | A1 | 2/2005 | Konno | |
| 2006/0231801 | A1 | 10/2006 | Carroll et al. | |
| 2006/0231803 | A1 | 10/2006 | Wang et al. | |
| 2006/0289055 | A1 | 12/2006 | Sridharan et al. | |
| 2006/0292938 | A1 | 12/2006 | Schwenke et al. | |
| 2007/0138659 | A1 | 6/2007 | Konno | |
| 2007/0187652 | A1 * | 8/2007 | Konno | 252/500 |
| 2007/0215203 | A1 | 9/2007 | Ishikawa et al. | |
| 2007/0253140 | A1 | 11/2007 | Randall et al. | |
| 2008/0206488 | A1 * | 8/2008 | Chung et al. | 427/596 |
| 2009/0188555 | A1 | 7/2009 | Castillo et al. | |

FOREIGN PATENT DOCUMENTS

| | | |
|---|---|---|
| EP | 0064211 | 11/1982 |
| EP | 0761617 | 3/1997 |
| EP | 1506944 A1 | 2/2005 |
| EP | 1713094 A2 | 10/2006 |
| EP | 1801891 A1 | 6/2007 |
| EP | 2015367 | 1/2009 |
| FR | 2348897 | 11/1977 |
| JP | 2281082 | 11/1990 |
| JP | 3280414 | 12/1991 |
| JP | 06-057183 | 3/1994 |
| JP | 07126037 | 5/1995 |
| JP | 2000264676 | 9/2000 |
| JP | 2005/243500 | 8/2005 |
| JP | 2005247602 | 9/2005 |
| JP | 2005281171 | 10/2005 |
| JP | 2006225255 | 8/2006 |
| JP | 3853793 | 9/2006 |
| JP | 2007049087 | 2/2007 |
| JP | 2007/235082 | 9/2007 |
| WO | WO-01/54203 A2 | 7/2001 |
| WO | WO-02082466 | 10/2002 |
| WO | WO-03/045584 A1 | 6/2003 |
| WO | WO-03106573 | 12/2003 |
| WO | WO-2004067647 | 8/2004 |
| WO | WO-2006/008896 | 1/2006 |
| WO | WO-2006/093398 | 9/2006 |
| WO | WO 2006/093398 * | 9/2006 |
| WO | WO-2006/132766 A2 | 12/2006 |
| WO | WO-2007/089273 A1 | 8/2007 |

OTHER PUBLICATIONS

Non-Final Office Action in U.S. Appl. No. 12/022,294, (Sep. 11, 2009), 50 pgs.
Sabo, C. J., et al., "Silver Thick Film Metallization for Photovoltaics Fired at 300° C", *Materials Engineering*, Purdue University, pp. 59-65.
Vest, G. M., et al., "Copper films from aqueous solutions of copper nitrate trihydrate", *Thin Solid Films*, Purdue University, Abstract, pp. 77-82.
Vest, G. M., et al., "MOD silver metallization for photovoltaics", *Energy Res. Abstr.*, Purdue Univ.
Vest, M. G., et al., "Synthesis of metallo-organic compounds for metallo-organic decomposition (MOD) powders and films", *Materials Research Society Symposium Proceedings*, Purdue University, Abstract, pp. 35-42.

(Continued)

*Primary Examiner* — Khanh Tuan Nguyen
(74) *Attorney, Agent, or Firm* — Servilla Whitney LLC

(57) ABSTRACT

A conductive ink having a glass frit, an organic medium a conductive species and one or more metallo-organic components which form metal oxides upon firing and reduce series resistance to a same or greater degree a ink that do not include metallo-organic components, is provided. Embodiments of conductive ink include metallo-organic components that include a bismuth metallo-organic component and glass frits comprising one or more of bismuth oxide, silica, boron oxide, tellurium dioxide, and combinations thereof. Embodiments of photovoltaic cells with an anti-reflection coating, gridlines formed from conductive ink incorporating one or more metallo-organic components, are also provided.

12 Claims, No Drawings

OTHER PUBLICATIONS

"Thomson Scientific, London, GB", *Database WPI Week 199528*, XP002526317, (May 16, 1995), 1-8 pgs.
"Thomson Scientific, London, GB", *Database WPI Week 200666*, XP002526318, (2006), 1-9 pgs.
"Thomson Scientific, London, GB", *Database WPI Week 200115*, XP00252319, (2001), 1-9 pgs.
"Thomson Scientific, London, GB", *Database WPI Week 200566*, XP002526320, (2005), 1-9 pgs.
PCT International Search Report for PCT/US2009/032107, (May 13, 2009), 4 pgs.
PCT International Search Report for PCT/US2009/032109, (May 8, 2009), 4 pgs.
"Thomson Scientific, London, GB", *Database WPI Week 199101*, XP002524728, (1991), 1-9 pgs.
"Thomson Scientific, London, GB", *Database WPI Week 199205*, XP002524727, (1992), 1-5, 8, 9 pgs.
PCT International Search Report for PCT/US2009/032112, (May 11, 2009), 4 pgs.
Sabo, C. J., et al., "Silver Thick Film Metallization for Photovoltaics Firewd at 3000o C.", *Proc. Int. Soc. for Hybrid Microelectron. Symp.*, Anaheim, CA, (1985), 59-66 pgs.
Non-Final Office Action in U.S. Appl. No. 12/022,403, dated Mar. 25, 2010, 31 pp.
Non-Final Office Action, U.S. Appl. No. 12/022,403, Oct. 26, 2010, 14 pgs.
Non-Final Office Action in U.S. Appl. No. 12/022,403 mailed Jul. 13, 2011, 9 pgs.
Final Office Action in U.S. Appl. No. 12/022,403, mailed Nov. 29, 2011, 9 pgs.
"Final Office Action", U.S. Appl. No. 12/022,403 Aug. 13, 2010, 17 pages.

\* cited by examiner

CONDUCTIVE INKS WITH METALLO-ORGANIC MODIFIERS

TECHNICAL FIELD

Embodiments of the present invention relate to conductive inks including a frit and one or more metallo-organic components and photovoltaic cells having conductive grid lines formed from conductive inks which include a frit and one or more metallo-organic components.

BACKGROUND

Conductive inks or pastes are used to form metal contacts, such as silver gridlines and bus bars, on the surface of substrates such as silicon. Such substrates can be used in solar cells or photovoltaic cells which convert solar energy to electrical energy when photons from sunlight excite electrons on semiconductors from the valance band to the conduction band. The electrons which flow to the conduction band are collected by the metal contacts. Crystalline silicon solar cells in today's industry are typically coated with an anti-reflection coating to promote light adsorption, which increases cell efficiency. However, the anti-reflection coating also works as an insulator by preventing electrons from transferring from the substrate to the metal contact. Solar cells are typically covered by the anti-reflection coating before a conductive ink is applied. The anti-reflection coatings often comprise silicon nitride, titanium oxide or silicon oxide.

Conductive inks usually include a glass frit, conductive species and an organic medium. The conductive species, typically metal particles such as silver, provide conductive properties and function as current collectors after formation of the metal contacts. To form the metal contacts, conductive inks are printed onto a substrate. The substrate is then fired at a temperature in the range of about 650° C. to about 950° C. A sintering aid is in most instances because the firing temperature is lower than the eutectic point of silver and silicon, and the silver melting point. In addition, solar cells are typically covered by an anti-reflection coating before a conductive ink is applied. The conductive ink should penetrate the anti-reflection coating disposed on the substrate to form metal contacts having ohmic contact with the substrate.

Conductive inks incorporate glass frits to aid with sintering metal particles to a substrate and to promote adhesion and ohmic contact between the formed metal contact and the substrate. Depending on the formulation, glass frits can liquefy upon firing at a temperature between about 300° C. and 600° C. When the glass frit liquefies, it tends to flow toward the interface between the metal particles and the anti-reflection coating disposed on the substrate. The melted glass dissolves the anti-reflection coating materials as well as some of the silver and substrate. Once the temperature decreases, the molten silver and the melted or dissolved substrate recrystallize through the liquid phase. As a result, some of the silver crystallites are able to penetrate the anti-reflection layer and form ohmic contact with the substrate. This process is referred to as "fire-through" and facilitates a low contact resistance formation and a stronger bond between silver and the substrate. If a selected frit too aggressive, the substrate can be contaminated thereby degrading the solar cell performance. Selection of appropriate frits or mixtures of frit-precursors helps to avoid such contamination and to achieve good cell efficiency.

Accordingly, there is a need for a conductive ink which improves the series resistance in a photovoltaic cell, aids in sintering and also has the capability of promoting adhesion and ohmic contact of metal contacts and the substrate through anti-reflection coatings.

SUMMARY

In accordance with one aspect of the present invention, conductive inks are provided which utilize a glass frit, a conductive species, an organic medium and one or more metallo-organic components that form metal alloys or metal oxides upon firing. As used throughout this application, the terms "paste" and "ink" shall be used interchangeably.

In one or more embodiments, the frit and one or more metallo-organic components of the conductive ink are combined in a paste adapted to be applied to a substrate, such as a photovoltaic cell, which reduces series resistance of the photovoltaic cell to the same or greater degree as photovoltaic cells with pastes applied thereon which do not include metallo-organic components. When applied to an anti-reflection coating disposed on a substrate, the conductive ink of another embodiment is capable of penetrating the anti-reflection coating to form ohmic contact with the substrate.

In further embodiments, the one or more metallo-organic components are present in the ink in an amount sufficient to form about 1% by weight of metal oxide upon firing. In some embodiments, the conductive ink has one or more metallo-organic components in an amount less than about 40% by weight. In a specific embodiment, the one or more metallo-organic components are present in an amount less than about 15% by weight. In a more specific embodiment, the metallo-organic components are present in an amount less than about 8% by weight.

Another embodiment of the invention provides for an ink which utilizes a frit that includes one or more of bismuth oxide, silica, boron oxide, tellurium dioxide, and combinations thereof.

In accordance with one or more embodiments, the conductive ink includes a bismuth metallo-organic component. In a specific embodiment, the bismuth metallo-organic component is present in the conductive ink in an amount of about 4% by weight. In a more specific embodiment, the conductive ink can include bismuth metallo-organic component and a frit containing one or more of bismuth oxide, silica, boron oxide, tellurium dioxide, and combinations thereof.

In accordance with another aspect of the present invention, a photovoltaic cell includes a semiconductor substrate, an anti-reflection coating and conductive gridlines formed from a conductive ink, which includes a frit and one or more metallo-organic components. The conductive ink used in one embodiment of the photovoltaic cells has been fired to form gridlines comprising a metal oxide phase and a conductive species. In one or more embodiments, the conductive ink has been processed to remove the organic medium and sinter the conductive species. According to one embodiment of the present invention, the conductive ink includes a frit comprising one or more of bismuth oxide, silica, boron oxide, tellurium dioxide, and combinations thereof. In another embodiment, one or more metallo-organic components are present in the conductive ink in an amount sufficient to form, upon firing, at least about 1% by weight of metal oxide. In a specific embodiment, one or more metallo-organic components are present in an amount less than about 40% by weight. A more specific embodiment includes one or more metallo-organic components in an amount less than about 15% by weight, while an even more specific embodiment has the one or more metallo-organic components present in an amount less than about 8% by weight.

In accordance with one or more embodiments, the photovoltaic cells include conductive inks comprising a bismuth metallo-organic component. More specific embodiments have conductive inks comprising a bismuth metallo-organic component present in an amount about 4% by weight. Even more specific embodiments of photovoltaic cells utilize a bismuth metallo-organic component and a frit which includes one or more of bismuth oxide, silica, boron oxide, tellurium dioxide, and combinations thereof.

The foregoing has outlined rather broadly certain features and technical advantages of the present invention. It should be appreciated by those skilled in the art that the specific embodiments disclosed may be readily utilized as a basis for modifying or designing other structures or processes within the scope of the present invention. It should also be realized by those skilled in the art that such equivalent constructions do not depart from the spirit and scope of the invention as set forth in the appended claims.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Aspects of the present invention pertain to conductive inks with one or more metallo-organic components, at least one frit, conductive species and other components, which will now be discussed in greater detail. In addition, aspects of the present invention pertaining to photovoltaic cells will also be discussed in greater detail.

Metallo-organics

One or more embodiments of the present invention include conductive inks having one or more metallo-organic components. Generally, metallo-organics are compounds containing metal atoms, including metal carboxylate such as neodecanoates, acetates and propionates, metal alkoxide and metal complexes, which are sparingly soluble or insoluble in water. Metallo-organics can also contain any aromatic or aliphatic groups and are sometimes referred to as metal resinates when the organic portion consists of groups derived from resins or other natural products. Other suitable metallo-organic components include metal mercaptides. The metallo-organic components used in one or more embodiments can have more than one kind of metal atom.

Examples of metallo-organic components used with one or more conductive inks include a combination of boron-metallo-organic, aluminum-metallo-organic, silicon-metallo-organic, bismuth-metallo-organic, zinc-metallo-organic and vanadium-metallo-organic. Sometimes metallo-organics and organo-metallics are defined as two categories. As used throughout this application, the term "metallo-organic" includes both metallo-organics and organo-metallics.

Without being bound by theory, it is believed that, upon firing, the metallo-organic components will decompose and the organic portions are removed from the conductive ink. Further, metal or metal alloy or metal oxide mixtures can be generated. The amount of solid material generated after firing is referred as "solid content of the metallo-organic components by weight percent." In accordance with one or more embodiments, the metallo-organic component(s) can have at least 0.5% solid content by weight. Another embodiment includes metallo-organic component(s) having at least 1-2% solid content by weight. Without being limited by theory, it is believed that, similar to the use of glass frit in conductive inks, the amount of solid material generated by metallo-organic component(s) influences the ability of the conductive ink to form an electrical conductor on or form ohmic contact with the substrate. This ability consequently, drives the performance of the device incorporating conductive ink, such as a semiconductor, a photovoltaic cell or an automotive glass.

In one or more embodiments of the invention, the metallo-organic components include bismuth metallo-organic components, and/or silver metallo-organic components. A specific embodiment of the invention can include one or more of bismuth metallo-organic components, silver metallo-organic components or boron metallo-organic components. Another embodiment of the invention includes one or combinations of bismuth metallo-organic components, silver metallo-organic components, boron metallo-organic components, aluminum metallo-organic components, zinc metallo-organic components and/or vanadium metallo-organic components.

According to one embodiment, to achieve desired properties, single element or metal oxides or colloidal metal suspensions can be added to the metallo-organic components as modifiers to enhance a certain element content or bring in new properties. For example, phosphorous, $P_2O_5$ or other type of phosphorous-contained compound can be added to make self-doping pastes for use in solar cell applications.

Additional factors for formulating metallo-organic components may be considered to adjust the resulting properties. One consideration includes controlling the aggressiveness of the conductive ink on the anti-reflection coating and to avoid contamination of the substrate. Another consideration includes selecting a thermal decomposition temperature in the range from about 200° C. to about 500° C. or in another range depending on the firing profile, to provide enough time and heat for the solid mixture decomposed from the metallo-organic component(s) to react with the conductive species and anti-reflection coating. The use of metal carboxylates or low temperature chemical vapor deposition ("CVD") precursors can be considered for adjusting the decomposition temperature. A third consideration includes selecting one or more metallo-organic components which have a consistency suitable for printing or which can also be used as rheology modifiers.

Conductive Species

In one or more embodiments, the conductive ink utilizes a conductive species such as silver in powdered or particular form. Other non-limiting examples of suitable conductive species include conductive metals such as gold, copper and platinum in powdered or particulate form.

The silver species used in one or more embodiments can be in the form of one or more fine powders of silver metal or silver alloys. In other embodiments, silver can be added as silver salts such as silver nitrate ($AgNO_3$). According to one or more embodiments, the conductive species should be capable of being sintered at a temperature greater than about 500° C.

One or more embodiments omit the use of conductive species and, instead, utilize metallo-organic components which form one or more conductive metal elements upon firing. Examples of conductive metal elements include copper, silver, gold, platinum and/or other precious metals and combinations thereof. One or more embodiments utilize both conductive species and metallo-organic components which form conductive metal elements upon firing.

Glass Frits

Glass frit powders used in one or more embodiments of the present invention contain one or more of bismuth oxide, silica, boron oxide, tellurium dioxide, and combinations thereof.

One specific embodiment includes a glass frit which incorporates tellurium dioxide and has no intentionally added lead. In such embodiments, the term "no intentionally added lead" means a glass frit having lead in an amount less than about 1,000 ppm. In a specific embodiment, the glass frit includes tellurium dioxide in an amount between about 0.01% by weight and 10% by weight. A more specific embodiment of a glass frit used in accordance with the present invention includes tellurium dioxide, ZnO, $Al_2O_3$ and combinations thereof. An even more specific embodiment of a tellurium dioxide-containing glass frit can also include other components such as $Ag_2O$, $Sb_2O_3$, $GeO_2$, $In_2O_3$, $P_2O_5$, $V_2O_5$, $Nb_2O_5$, and $Ta_2O_5$. Additional embodiments of the present invention utilize alkaline metal oxides and/or alkaline earth metal oxides such as $Na_2O$, $Li_2O$, and/or $K_2O$ and BaO, CaO, MgO and/or SrO, respectively.

In one embodiment, the glass frit utilized in the conductive ink according to the present invention comprises more than about 20% and less than about 60% by weight of $Bi_2O_3$, about 15% to about 30% by weight of $SiO_2$, and about 2% to about 9% by weight of $B_2O_3$, wherein the glass frit is substantially free of $Na_2O$. According to one or more embodiments, substantially free of $Na_2O$ shall mean that $Na_2O$ is present in the frit in an amount in the range of about 0% to 0.2% by weight.

Conductive inks according to one or more embodiments of the present invention also incorporate bismuth tellurate and/or bismuth silicate powders. It has been found that the addition of bismuth tellurate and/or bismuth silicate powders can control crystallization of the glass frit by shifting the onset of crystallization to lower temperatures.

While the present invention should not be bound by theory, it is believed that bismuth tellurate and/or bismuth silicate powders provide nucleation sites for crystal growth. In a photovoltaic application, the glass frit should penetrate through or dissolve the anti-reflective layer to enable the silver to form ohmic contact, however, controlling the aggressiveness of glass frit is desired to prevent it from penetrating through the junction of the semiconductor which would shunt the device. Other embodiments utilize other known phases which produce the same or similar effect as bismuth tellurate and/or bismuth silicate, such as titania, zirconia, phosphorous compound and others.

Other Components

The conductive ink according to one or more embodiments may also include an organic vehicle. The organic vehicle disperses the particulate components and facilitates transfer of the ink composition onto a surface. In at least one embodiment, the organic vehicle includes any suitably inert solvent, resins and commonly used surfactants. Specifically, the organic vehicle dissolves the resins and disperses the conductive species and metallo-organic components to form a conductive ink having suitable rheology. Various organic vehicles with or without thickening agents, stabilizing agents and/or other common additives are suitable for use in the preparation of the embodiments of the present invention. Examples of solvents include alcohols (including glycols) as well as esters of such alcohols, terpenes such as pine oil, terpineol and the like. More specific solvents include dibutyl phthalate, diethylene glycol monbutyl ether, terpineol, isopropanol, tridecanol and 2,2,4-trimethyl-1,3-pentanediol monoisobutyrate. Some embodiments utilize solvents that also contain volatile liquids to promote faster drying after application to a substrate.

Examples of suitable resins include ethyl cellulose, methyl cellulose, nitrocellulose, carboxymethyl cellulose and other cellulose derivatives. Other examples include resins such as acrylic acid esters, methacrylic acid esters, polyvinyl alcohols, polyketones and polyvinyl butyrals.

In one specific embodiment, solutions of resins such as polymethacrylates of lower alcohols are used, while in a more specific embodiment, the organic vehicle includes ethyl cellulose in solvents such as pine oil and monobutyl ether of diethylene glycol.

According to one or more embodiments, the ratio of organic vehicle to solids in the conductive ink can vary considerably and is determined by the final desired formulation rheology which, in turn, is determined by the printing requirements of the system. In one or more embodiments, the conductive ink can contain about 50 to about 95% by weight solids and about 5% to about 50% by weight organic vehicle.

One or more embodiments of the conductive inks may additionally comprise further additives known in the art, such as colorants and staining agents, rheology modifiers, adhesion enhancers, sintering inhibitors, green-strength modifiers, surfactants and the like.

The conductive ink according to one or more embodiments may be prepared by suitable equipment, such as a triple-roll mill. In at least one embodiment, the one or more metallo-organic components, glass frit, conductive species and organic vehicles are pre-mixed and dispersed on the mill.

Photovoltaic Cells

Another aspect of the present invention provides for photovoltaic cells comprising a semiconductor substrate, an anti-reflection coating on the substrate and conductive gridlines. According to one or more embodiments, the conductive gridlines are formed from a conductive ink comprising a glass frit, a conductive species, an organic medium and one or more metallo-organic components. One or more of the embodiments of conductive inks disclosed herein can be used to form the conductive gridlines. According to one or more embodiments, one or more metallo-organic components are desired so that the conductive ink can penetrate or dissolve the anti-reflection coating on the substrate and establish ohmic contact.

In one or more embodiments, the semiconductor substrate can be silicon. Other suitable substrates known in the art can be utilized such as doped semiconductor substrates. According to one or more embodiments, the anti-reflection coatings can comprise silicon dioxide, titanium oxide, silicon nitride or other coatings known in the art.

The semiconductor substrate may comprise monocrystalline or multicrystalline silicon. The anti-reflection coatings can be applied to the substrate using chemical vapor deposition techniques. In some embodiments, plasma enhanced chemical vapor deposition techniques are used to apply an anti-reflection coating to the substrate. Semiconductor substrates according to one or more embodiments may also be etched or textured to reduce reflection of sunlight and enhance the level of absorption. According to one or more embodiments, the conductive ink is thereafter applied to the surface of the substrate or anti-reflection coating by screen printing or other technique. The substrate is heated or fired to a temperature of about 650° to 950° C. to form grid lines. In one embodiment, as otherwise discussed in this application, the firing process allows the glass frit to melt and penetrate the anti-reflection coating. In one or more embodiments, the conductive species forms crystallites at the interface of conductors and the substrate, which enhances electrical or ohmic contact between the conductors and the semiconductor substrate.

Without intending to limit the invention in any manner, embodiments of the present invention will be more fully described by the following examples.

EXAMPLES

The fill factor, cell efficiency and series resistance of six photovoltaic cells having six conductive inks (Inks A-C and Comparative Inks A-C) printed on each cell were tested to measure the performance of the device and the inks disposed thereon. Comparative Inks A-C included a silver conductive species and three different glass frits each. The glass frits included bismuth oxide, silica, boron oxide and zinc oxide. Inks A-C included a silver conductive species and a bismuth metallo-organic component. Ink A also includes the glass frit tested in Comparative Ink A, while Inks B and C include the glass frits tested in Comparative Inks B and C, respectively. The performance of each photovoltaic cell was measured and reproduced in Table 1. The resulting values of the photovoltaic cells with Inks A, B and C were normalized with respect to corresponding Comparative Inks A, B and C, respectively

TABLE 1

Solar cell testing results of conductive inks with and without metallo-organic components

| | Ink | Fill Factor | Cell Efficiency | Series Resistance (ohm/cm$^2$) |
|---|---|---|---|---|
| Frit 1 | Comparative Ink A | 1.00 | 1.00 | 1.00 |
| | Ink A | 1.45 | 1.47 | 0.20 |
| Frit 2 | Comparative Ink B | 1.00 | 1.00 | 1.00 |
| | Ink B | 1.14 | 1.14 | 0.39 |
| Frit 3 | Comparative Ink C | 1.00 | 1.00 | 1.00 |
| | Ink C | 1.08 | 1.10 | 0.60 |

The "fill factor" and "efficiency" are measures of the performance of a semiconductor. The term "fill factor" is defined as the ratio of the maximum power ($V_{mp} \times J_{mp}$) divided by the product of short-circuit current density ($J_{sc}$) and open-circuit voltage ($V_{oc}$) in current-voltage (I-V) characterization of solar cells. The open circuit voltage (Voc) is the maximum voltage obtainable under open-circuit conditions. The short circuit current density ($J_{sc}$) is the maximum current density without the load under short-circuit conditions. The fill factor (FF), is thus defined as ($V_{mp}J_{mp}$)/($V_{oc}J_{sc}$), where $J_{mp}$ and $V_{mp}$ represent the current density and voltage at the maximum power point.

The term "efficiency" is the percentage of power converted (from absorbed light converted to electrical energy) and collected when a solar cell is connected to an electrical circuit. Efficiency ($\eta$) is calculated using the ratio peak power ($P_m$) divided by the product of total incident irradiance (E, measured in Wm$^{-2}$) and device area (A, measured in m$^2$) under "standard" test conditions where $\eta = P_m/(E \times A)$.

As shown in Table 1, Inks A, B and C exhibited a greater efficiency than Comparative Inks A, B and C, respectively. Accordingly, based on this data, it is believed that the addition of one or more metallo-organic components to a conductive ink will improve performance of a photovoltaic cell.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A conductive ink for application to a semiconductor for use as a photovoltaic cell comprising a glass frit including no intentionally added lead; a conductive species; an organic medium; and one or more metallo-organic components that form metal oxides upon firing, wherein the glass frit and metallo-organic components are combined in a paste adapted to be applied to a substrate, the ink adapted to reduce series resistance of the photovoltaic cell to the same or greater degree as inks that do not include metallo-organic components, wherein the one or more metallo-organic components comprises a bismuth metallo-organic compound and the frit comprises bismuth oxide, wherein the metallo-organic components are present in an amount sufficient to form metal oxide in an amount of at least about 1% by weight upon firing.

2. The ink of claim 1, wherein the metallo-organic components are present in an amount less than about 40% by weight.

3. The ink of claim 2, wherein the metallo-organic components are present in an amount less than about 15% by weight.

4. The ink of claim 3, wherein the metallo-organic components are present in an amount less than about 8% by weight.

5. The ink of claim 1, wherein the bismuth metallo-organic is present in an amount about 4% by weight.

6. The ink of claim 1, wherein the glass frit further comprises one or more of silica, boron oxide, tellurium dioxide, and combinations thereof.

7. The ink of claim 1, wherein upon application of the ink to an anti-reflection coating disposed on the substrate as part of a photovoltaic cell, the conductive ink is capable of penetrating the anti-reflection coating to form ohmic contact with the substrate.

8. The conductive ink of claim 1, wherein the conductive species comprises silver.

9. The conductive ink of claim 1, wherein the frit is substantially free of Na$_2$O.

10. The conductive ink of claim 9, wherein the frit further comprises one or more of silica, boron oxide, tellurium dioxide, and combinations thereof.

11. The conductive ink of claim 10, wherein the frit is substantially free of Na$_2$O.

12. The conductive ink of claim 11, wherein the conductive species comprises silver.

* * * * *